United States Patent
Schlupf et al.

(10) Patent No.: US 10,298,817 B1
(45) Date of Patent: May 21, 2019

(54) REDUCE MULTISPECTRAL IR SENSOR POWER USAGE

(71) Applicant: BAE SYSTEMS INFORMATION AND ELECTRONIC SYSTEMS INTEGRATION INC., Nashua, NH (US)

(72) Inventors: Joseph M. Schlupf, Newburyport, MA (US); Michael N. Mercier, Nashua, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 16/011,754

(22) Filed: Jun. 19, 2018

(51) Int. Cl.
| | |
|---|---|
| H01L 31/024 | (2014.01) |
| H01L 27/146 | (2006.01) |
| H04N 5/225 | (2006.01) |
| F28D 15/02 | (2006.01) |
| G02B 13/14 | (2006.01) |
| H04N 5/33 | (2006.01) |

(52) U.S. Cl.
CPC ..... H04N 5/22521 (2018.08); F28D 15/0275 (2013.01); G02B 13/14 (2013.01); H01L 31/024 (2013.01); H04N 5/2254 (2013.01); H04N 5/33 (2013.01); H01L 27/1462 (2013.01)

(58) Field of Classification Search
CPC .... G02B 6/4268; G02B 6/4269; G02B 13/14; H04N 9/3144; H04N 5/2252; H04N 5/2254; H04N 5/2258; H04N 5/33; H04N 5/22521; F28D 9/00; F28D 15/0275; H01L 31/024; H01L 27/1462

USPC .......................................................... 250/352
See application file for complete search history.

(56) References Cited

U.S. PATENT DOCUMENTS

| | | | |
|---|---|---|---|
| 6,144,031 A | 11/2000 | Herring et al. | |
| 6,169,486 B1 * | 1/2001 | Berkcan ................. | H05B 3/746 340/584 |
| 6,430,941 B1 * | 8/2002 | Mordechai ............... | G01J 5/06 250/352 |
| 6,831,221 B2 * | 12/2004 | Hulen ..................... | B60L 5/005 136/253 |
| 7,004,240 B1 | 2/2006 | Kroliczek et al. | |
| 7,549,461 B2 | 6/2009 | Kroliczek et al. | |
| 8,621,876 B2 | 1/2014 | Bin-Nun et al. | |
| 9,214,408 B2 * | 12/2015 | Esposito ............... | H01L 23/473 |

(Continued)

OTHER PUBLICATIONS

Author: Rogalski et al., Title: Infrared device and techniques, Date: 2002, Publisher: Opto-Electronics Review. (Year: 2002).*

*Primary Examiner* — Taeho Jo
(74) *Attorney, Agent, or Firm* — Sand, Sebolt & Wernow LPA

(57) ABSTRACT

An optical system recycles heat from a cooler coupled with an image sensor across a heat transfer element in order to warm and de-ice a window. The optical system may be implemented in high altitude or space vehicles/platforms, regardless of whether manned or unmanned, and the window may be outwardly facing relative to the vehicle/platform so at to allow electromagnetic radiation to pass therethrough onto the image sensor. The optical system enables the reduction of size, weight, and power by recycling heat exhausted from the cooler to warm the window, thus eliminating the need for a separate de-icing system or device for the window.

16 Claims, 8 Drawing Sheets

(56) References Cited

U.S. PATENT DOCUMENTS

| | | | | |
|---|---|---|---|---|
| 2001/0024485 A1* | 9/2001 | Rogers | F28D 15/02 | 378/140 |
| 2003/0016728 A1* | 1/2003 | Gerlitz | G01J 5/02 | 374/121 |
| 2008/0024733 A1* | 1/2008 | Gerets | G02F 1/133553 | 353/52 |
| 2012/0318979 A1* | 12/2012 | Pallister | G01J 5/041 | 250/330 |
| 2013/0070102 A1* | 3/2013 | Gustafson | H04N 5/33 | 348/164 |
| 2014/0190666 A1* | 7/2014 | Schlie | F41G 11/00 | 165/104.21 |
| 2014/0221743 A1* | 8/2014 | Sugiyama | A61B 1/127 | 600/109 |
| 2016/0104806 A1* | 4/2016 | Thrush | H01L 27/1462 | 257/434 |
| 2017/0285335 A1* | 10/2017 | Moncino | G02B 27/00 | |
| 2018/0059690 A1* | 3/2018 | Coleman | B23P 11/00 | |

* cited by examiner

REDUCE MULTISPECTRAL IR SENSOR POWER USAGE

BACKGROUND

Technical Field

The present disclosure relates generally to an optical system. More particularly, the present disclosure relates to an optical system that reduces power usage. Specifically, the present disclosure relates to a heat transfer element that transfers heat exhausted from a cooler or cooling device coupled with a sensor to warm optical glass permitting electromagnetic radiation passing therethrough.

Background Information

Imaging systems have many applications, such as military targeting and night vision systems, and commercial digital cameras. A typical imaging system generally includes a lens or optics that is configured to focus light or radiation onto a sensor or a focal plane array (FPA) via an aperture. A shutter, which is generally consider as part of the optics, is interposed between the lens and the FPA, and operates to prevent a scene from imaging on the FPA. The shutter is typically open most of the time, and is closed for short periods of time during calibration.

Each cell of the FPA generates a detector current when a scene is imaged. Each detector current generated by the FPA is applied to the input of a corresponding integrator circuit included in the FPA read-out circuit. In operation, the integrator is reset by closing the reset switch, which initializes the integration process to a known starting voltage. The reset switch is then opened to begin integration. Any current (e.g., Input) then flowing into the input current node is integrated onto the integration capacitor. These FPA sensors use materials such as amorphous silicon, vanadium oxide (VOx) and barium strontium titanate (BST) to form thermal imager detectors.

In some optical systems to reduce the background noise, the FPA needs to be cooled to cryogenic temperatures, typically less than 150K. To reduce the background signal from the baffling, the baffling must either be cooled or a re-imaging optical design must be used in conjunction with an appropriately placed optical cold stop to block the baffling from the field-of-view of the FPA detectors. Such techniques allow a high signal-to-noise ratio to be maintained. In cryogenic FPA applications, a cooling fluid is applied to the FPA via a cooling interface. Heat is transferred to the cooling fluid from the FPA. In one example, the heated fluid is then expelled from a projectile or re-cooled via a heat exchanger integrated into the FPA. The cooling fluid requires a heavy and bulky FPA cooling interface and heat exchanger, which are attached to the FPA mounting assembly. Consequently, the FPA assembly must have additional mechanical support to secure the interface, heat exchanger, and cooling fluid. The bulky components and additional support hardware may require additional cooling, which increases demands placed on the cooling system. The bulky support structure, conventionally thought to improve temperature stability, may conduct excess heat into the FPA, thereby reducing system cooling efficiency. Furthermore, the additional bulky mechanical FPA support hardware may cause alignment problems with the on board optical or infrared system during installation and operation, thereby increasing installation and operating costs. Additionally, cryogenically cooled IR imaging systems are relatively expensive and are associated with a number of difficulties related to maintaining cryogenic conditions.

Microbolometers are another type of IR FPA, which operate near room temperature, thereby eliminating the need for cryogenic cooling, as well as reducing cost and complexity of the system. A thermoelectric cooler can be attached to the back of the FPA, and a temperature controller and sensing scheme is employed to stabilize the temperature of the FPA and its housing at room temperature (about 22° C.). However, such a microbolometer cannot achieve the same high sensitivity as a cryogenically cooled imager. The noise due to the IR background signals from the optics, shutter, and baffling are present, just as in the cryocooled imager. In addition, the uncooled imager has added noise due to the ambient temperature uncooled detectors and their readout circuits that is not present in imagers with cooled FPA detectors.

Moreover, microbolometers may suffer from excessive spatial non-uniformity caused by the conjunction of four factors: (1) microbolometer detectors are DC coupled; (2) the steradiance seen by a microbolometer detector varies with the spatial position of the detector in the array; (3) the imaging device, including its optics, shutter, FPA, and baffling, is not iso-thermal; and (4) the setup calibration is done with an improperly placed shutter.

In more detail, a DC background signal, provided by each pixel of the FPA in the absence of an IR scene, is substantially higher in a non-cryogenic system as compared to a cryogenically cooled system. These DC background signals translate to lower signal-to-noise ratio and compressed dynamic range. The DC background signals can be removed, usually by AC coupling or subtraction methods. However, this does not improve the signal-to-noise ratio. In fact, background subtraction often degrades the signal-to-noise ratio.

To compensate for DC background signals, a calibration process can be performed, where the FPA is shielded from IR scenes, and a DC background signal is generated by each pixel of the FPA. The system DC background signal, given by the average DC background signal of each pixel, is provided on a pixel-by-pixel basis. When an IR scene is imaged, an offset attributed to the known DC background signal is accounted for, and the actual signals attributed to the imaged IR scene are computed, thereby providing a corrected scene image signal.

An imaging system's DC background signal can be periodically determined in the field by providing a shutter for blocking the camera aperture. The calibration procedure is typically performed each time the imaging system is powered up, so that a new system DC background signal is available for each power-up session. It is also typical that an imaging system be recalibrated each time any of the imaging optics of the system are changed or repaired, as well as at periodic intervals during normal imaging operation.

As the FPA sensors absorb incoming infrared radiation, they detect minute changes in resistance in the case of microbolometers made of VOx or amorphous silicon or changes in capacitance for the BST ferroelectric sensors rather than converting the electromagnetic radiation to electrons. These FPA devices operate at or near room temperature, a characteristic that reduces system complexity, size, and cost.

Furthermore, an FPA may have a system gain and dark level that are not constant as a function of temperature. System gain and dark level are important in producing accurate image data, and since the temperature of an FPA varies, e.g., based on changes in the environment external to the imaging system as well as changes in temperature due to changes in operation within an imaging system, variation in temperature can present a challenge to creating accurate image data. A typical solution for this problem is to utilize thermoelectric cooling to control the temperature of the FPA. As long as the thermoelectric cooling maintains a constant, known temperature at the FPA, and as long as the correct system gain and dark level at that temperature are known, the FPA can be used to produce accurate image data.

Additionally, a typical FPA also has pixel to pixel variation in behavior due to manufacturing variance and the like. This variation is typically addressed by calibrating each pixel and saving the pixel by pixel calibration data as a correction map used to correct signals from the pixels to produce accurate image data. Pixel performance varies as a function of temperature, and so the temperature at which a correction map is created is the temperature at which the system generates the most accurate images—changes in temperature at the FPA will reduce the effectiveness of the correction map. A typical solution for this problem is to use thermoelectric cooling to control the temperature of the FPA as described above. As long as the thermoelectric cooling maintains a constant, known temperature at the FPA, and using a correction map that corresponds to that known temperature, the FPA can be used to produce accurate image data regardless of ambient temperature.

Thus, it is well known to attached different types of cooling devices to an FPA. Cooling devices have a cool side and a warm side. The cool side of the cooling device is coupled to the FPA in order to cool the same. Typically, the warm side is connected with a heat sink to dissipate the heat exhausted from the cooler. The manner which the heat is exhausted through the heat sink has not been extensively studied. In fact, typical heat sinks in optical systems are simply disposed in locations that are convenient to dissipate the excess or exhausted heat. The heat is not re-utilized or re-applied to other elements of the system that may need to be warmed.

Optical systems that include the FPA typically have at least one optical glass at the front of the optical system through which light passes. When the optical system is employed in an aerial vehicle, such as an aircraft, helicopter, space shuttle, satellite, drone, regardless of whether it is manned or unmanned, the optical glass in the optical system may have a need to be de-iced. Deicing the optical glass may be accomplished through mechanical, chemical, or other non-mechanical and non-chemical manners. In each scenario, the deicing of the optical glass requires additional size, weight, and power to be added to the optical system in order to de-ice (i.e., warm, either mechanically or chemically) the optical glass.

SUMMARY

Issues continue to exist with optical systems as they related to cooling devices coupled to FPAs, optical glass that needs to be de-iced, and the need to reduce size, weight, and power. The present disclosure address these and other issues by providing an optical system having a cooler coupled with an FPA that uses heat exhausted from the FPA to warm optical glass. In one embodiment, a heat transfer element is coupled with the output or exhaust of the cooler to transfer heat to the optical glass in order to warm (i.e., de-ice) the same.

More particularly, high performance multispectral IR sensors require cooling the FPA to improve sensitivity. Typically, a maximum power draw of the optical system occurs when the FPA and the system is turned on. At the same time, in cold conditions the optical system also requires additional power to heat the sensor window for an anti-icing or de-icing capabilities. Current threat warning power supplies for UV systems don't need the cooler and only provide enough power for the sensor window heater. Thus, an exemplary embodiment of the present disclosure may provide a mechanical heat conductive pipe that takes heat from the cooler output and pushes it to the sensor window. If sensor cooling happens to be detrimental to its operation, an electrical or a mechanical disconnect cut-off switch may be implement to "turn off" this additional cooling. The window heater may still need to operate in some conditions, but this reduces the overall power needed for the optical system.

In one aspect, an exemplary embodiment of the present disclosure may provide an optical system recycles heat from a cooler coupled with an image sensor across a heat transfer element in order to warm and/or de-ice a window. The optical system may be implemented in high altitude or space vehicles/platforms, regardless of whether manned or unmanned, and the window may be outwardly facing relative to the vehicle/platform so at to allow electromagnetic radiation to pass therethrough onto the image sensor. The optical system enables the reduction of size, weight, and power by recycling heat exhausted from the cooler to warm the window, thus eliminating the need for a separate de-icing system or device for the window.

In another aspect, an exemplary embodiment of the present disclosure may provide an optical system comprising: a window adapted to receive an electromagnetic wave therethrough; a sensor adjacent the window adapted to sense the electromagnetic wave; a cooler coupled to the sensor to maintain the sensor at an optimal operating temperature, and the cooler having a heat output; a heat transfer element coupling the heat output of the cooler with the window to transfer heat exhausted from the cooler to warm the window. This exemplary embodiment or another exemplary embodiment may further provide wherein the window includes: a first surface opposite a second surface defining a longitudinal direction therebetween, wherein the electromagnetic wave propagates in the longitudinal direction through the window; wherein the heat transfer element is coupled, at least indirectly, to the window to dissipate heat orthogonal to the longitudinal direction. This exemplary embodiment or another exemplary embodiment may further provide a top end and a bottom end defining a vertical direction therebetween; wherein heat is dissipated from the heat transfer element in the vertical direction. This exemplary embodiment or another exemplary embodiment may further provide wherein the first surface of the window is a major exterior surface and the second surface is a major interior surface, further comprising: wherein the heat transfer element outputs heat across the major interior surface of the window, and the window is fabricated from a thermally conductive material permitting heat to move longitudinally through the window to warm the major exterior surface. This exemplary embodiment or another exemplary embodiment may further provide wherein the first surface of the window is a major exterior surface and the second surface is a major interior surface, further comprising: wherein the heat transfer element outputs heat across the major exterior surface of the window, and the window is fabricated from a thermally conductive material permitting heat to move longitudinally through the window to warm the major interior surface. This exemplary embodiment or another exemplary embodiment may further provide a minor surface of the window defined by the bottom end formed from a thickness of the window between the first surface and the second surface; wherein the heat transfer element outputs heat to the minor surface of the window, and the window is fabricated from a conductive material permitting heat to move in a direction that is orthogonal to the longitudinal direction. This exemplary embodiment or another exemplary embodiment may further provide a first side and a second side defining a transverse direction therebetween; wherein heat is dissipated from the heat transfer element in the transverse direction. This exemplary embodiment or another exemplary embodiment may further provide a minor surface of the window defined by the first side formed from a thickness of the window between the first surface and the second surface; wherein the heat transfer element outputs heat to the minor surface of the window, and the window is fabricated from a conductive material permitting heat to move in a transverse direction that is orthogonal to the longitudinal direction. This exemplary embodiment or another exemplary embodiment may further provide a heat pipe including a first end and a second end, wherein the first end is coupled to the heat output of the cooler and the second end is coupled, at least indirectly, to the window. This exemplary embodiment or another exemplary embodiment may further provide a bore defined by the heat pipe extending between the first end and the second end, wherein heat exhausted from the cooler travels through the bore of the heat pipe from the cooler to the window. This exemplary embodiment or another exemplary embodiment may further provide fluid in the bore to effectuate heat transfer through the fluid from the heat output of the cooler to the window. This exemplary embodiment or another exemplary embodiment may further provide a wick in the bore to effectuate heat transfer along the wick from the heat output of the cooler to the window. This exemplary embodiment or another exemplary embodiment may further provide an internal diameter of the bore that is less than a thickness of the window. This exemplary embodiment or another exemplary embodiment may further provide an internal diameter of the bore that equals a thickness of the window. This exemplary embodiment or another exemplary embodiment may further provide an internal diameter of the bore that is greater than a thickness of the window. This exemplary embodiment or another exemplary embodiment may further provide at least one bend in the heat pipe positioned closer to the second end than the first end, wherein the bend is at least 45° relative to a major axis of the heat pipe. This exemplary embodiment or another exemplary embodiment may further provide wherein the bend in the heat pipe is about 90° and adjacent the second end to direct heat outwardly from the heat pipe and onto the window. This exemplary embodiment or another exemplary embodiment may further provide optics adjacent the window adapted to receive the electromagnetic wave therethrough; and wherein the heat transfer element includes a first end coupled to the cooler and a second end coupled, at least indirectly, to the window, and an central portion having a major axis of the heat transfer element positioned between the first end and the second end, wherein the central portion is positioned adjacent the optics. This exemplary embodiment or another exemplary embodiment may further provide de-icing logic controlling the cooler to cool the sensor and controlling the heat transfer element to warm the window. This exemplary embodiment or another exemplary embodiment may further provide at least one non-transitory computer readable storage medium having instructions encoded thereon that when executed by a processor implement operations to maintain the sensor at the optimal operating temperature and selectively warm the window, the instructions including: determine whether the window needs to be deiced; effectuate heat transfer across the heat transfer element in response to a determination that the window needs to be deiced; and continue to transfer heat to the window across the heat transfer element until the window no longer needs to be de-iced.

BRIEF DESCRIPTION OF THE SEVERAL VIEWS OF THE DRAWINGS

Sample embodiments of the present disclosure are set forth in the following description, is shown in the drawings and is particularly and distinctly pointed out and set forth in the appended claims.

Similar numbers refer to similar parts throughout the drawings.

DETAILED DESCRIPTION

Figure 1:
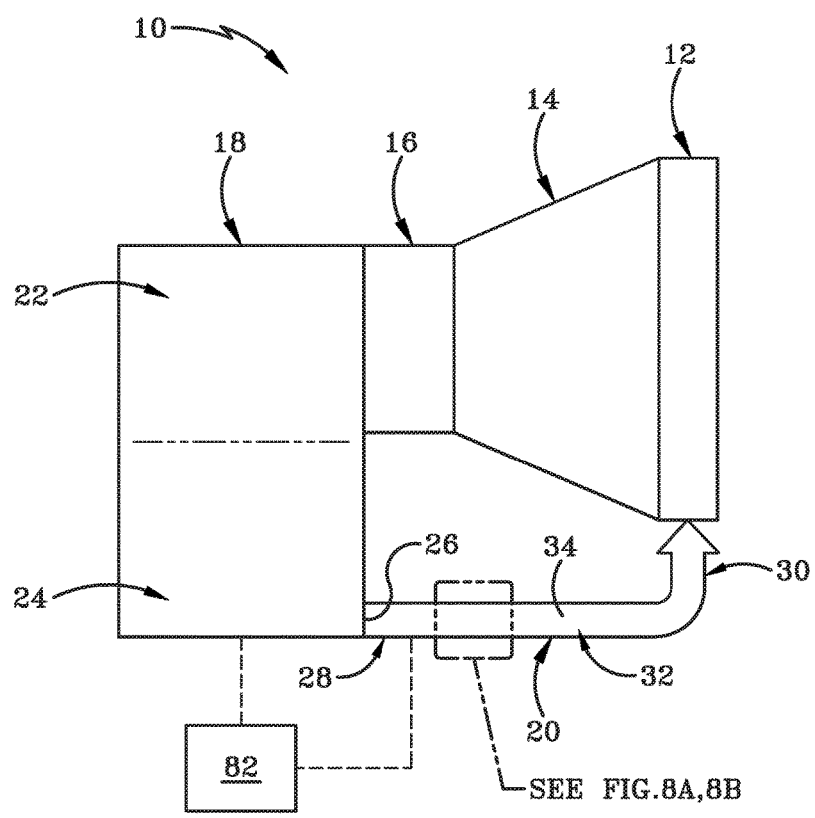
FIG. 1 is a diagrammatic side elevation view of an optical system in accordance with the present disclosure including a heat transfer element that recycles and dissipates heat from a cooler or cooling device coupled with an image sensor back to an optical window.

An optical system in accordance with the present disclosure is shown generally at 10. Optical system 10 includes a window 12, optics 14, a sensor 16, a cooler 18, and a heat transfer element 20. The heat transfer element 20 couples the cooler 18 with the window 12 to transfer heat exhausted from the cooler 18 to the window 12 in order to warm the window 12.

FIG. 1 depicts optics 14 located or positioned adjacent the window 12. The sensor 16 is positioned adjacent the optics 14 and adjacent the window 12 and is adapted to sense an electromagnetic wave, such as light or other radiation, received through the window 12 and through the optics 14. The sensor 16 is coupled with the cooler 18 which may include a cold or cool side 22 and a hot or warm side 24. The cooler 18 may include a heat output 26 at or near the hot side 24.

The cooler 18 is configured to cool the sensor 16 and to maintain it within an optimal operating temperature range. Maintaining the sensor 16 in an optimal cool temperature range by the cooler 18 enables the sensor 16 to reduce or minimize or infrared radiation emission such that pixel to pixel temperature dependent response variations of individual sensor pixel elements is reduced or eliminated since the sensor signal in response to thermal energy generated at lower temperatures is a minimal value. By maintaining the sensor 16 at an optimal temperature, a high signal to noise ratio may be maintained. Furthermore, maintaining the sensor 16 at an optimal cool temperature provides a uniform substantially zero DC background signal by each pixel in the sensor active area in the absence of an infrared seam, such as when a camera aperture is blocked by shutter. Furthermore, a cooled sensor 16 provides good sensitivity to IR radiation at low levels and high contrast IR image scene signal by providing a high signal to noise ratio. In one particular example, the cooler 18 may be a thermoelectric cooler (TEC) attached to the back of the sensor 16. A closed loop temperature controller and temperature sensor mounted proximate to the sensor 16 stabilizes the temperature of the sensor 16 and associated housing at a substantially constant temperature of about 22 degrees Celsius. A TEC, embodied as cooler 18, offers the benefits of lower cost and may be constructed to have uniform pixel to pixel detection against a DC background signal or dark signal provided by each pixel in the absence of an IR scene that is substantially higher than in an uncooled system.

In one particular embodiment, the sensor 16 is an infrared (IR) focal plane array (FPA) coupled with the optics 14 that may include one or more lens utilized to focus the light or electromagnetic wave propagating through the window 12 and the optics 14 onto the IR FPA sensor 16.

The heat transfer element 20 may include a first end 28, a second end 30, and a central portion or central section 32 extending between the first end 28 and the second end 30 substantially along a major axis of the heat transfer element 20. The first end 28 of the heat transfer element 20 may be coupled with the heat output 26 of the cooler 18. The second end 30 of the heat transfer element 20 may be coupled, at least indirectly, to the window 12.

In one particular example, the heat transfer element 20 may be embodied as a heat pipe 34. Heat pipe 34 may be constructed from an annealed hollow copper tube having a bore 36 extending substantially along a major axis 38 of the heat pipe 34. The heat pipe 34 may have a sintered copper powder wicking structure 40 disposed within the bore 36. Additionally, or alternatively, the heat pipe 34 may be filled with a working fluid 42, such as water, and use an evaporation cycle to remove thermal energy from the first end 28 of the heat pipe 34 to pass thermal energy to the second end 30. The ends of the heat pipe 34 are thermally conductive and may be respectively connected to the heat output 26 of the cooler 18 and the window 12 in a manner that effectuates thermal transfer, such as by soldering, conductive epoxy or clamping using thermally conductive grease in the joint.

Figure 2A:
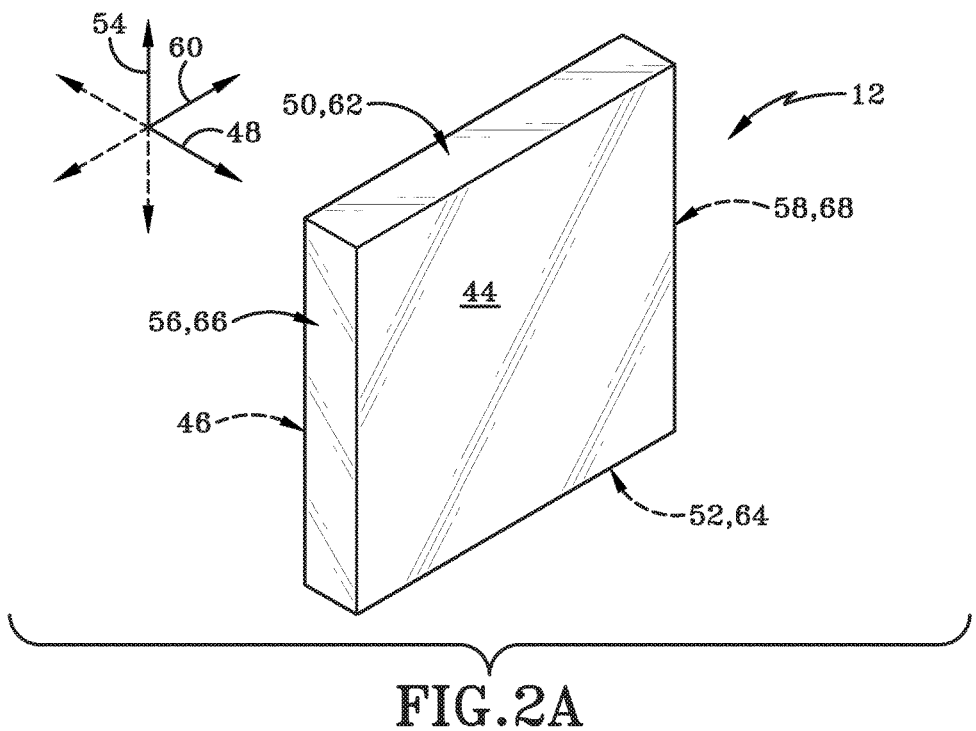
FIG. 2A is a front top perspective view of the optical window.
Figure 2B:
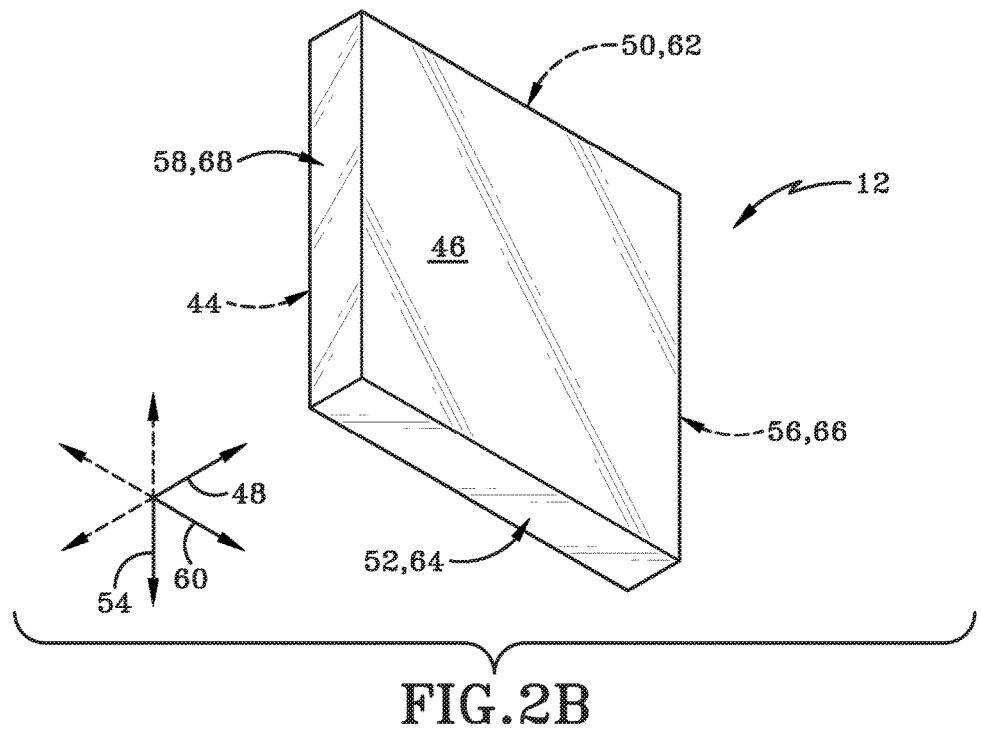
FIG. 2B is a rear bottom perspective view of the optical window.

FIG. 2A and FIG. 2B depict the window 12 in accordance with one embodiment of the present disclosure. The window 12 may include a first surface 44 and an opposite second surface 46 defining a longitudinal direction therebetween along a longitudinal axis 48. The window 12 further includes a top end 50 opposite a bottom end 52 defining a vertical direction therebetween along a vertical axis 54. The window 12 includes a first side 56 opposite a second side 58 defining a transverse direction therebetween along a transverse axis 60. The first surface 44 may define a major surface area and may be associated with the exterior of the optical system 10. Accordingly, the first surface 44 may be a major exterior surface of the window 12. Similarly, the second surface 46 may be a major surface area for an interior portion of the window 12 such that the second surface 46 is a major interior surface of the window 12. The thickness of the window 12 between the first surface 44 and the second surface 46 may define minor surface areas along the top end 50, the bottom end 52, the first side 56, and the second side 58. For example, the top end 50 may define a minor surface area 62 established by the thickness of the window 12 between the first surface 44 and the second surface 46 and the width of the window 12 between first side 56 and second side 58. Further, a minor surface 64 may be defined by the thickness of the window 12 between the first surface 44 and the second surface 46 between first side 56 and second side 58. A minor surface 66 may be defined by the thickness of the window 12 between the first surface 44 and the second surface 46 and the height of the window 12 between the top end 50 and the bottom end 52. A minor surface area 68 may be defined by the thickness of the window 12 between the first surface 44 and the second surface 46 and the height of the window 12 between the top end 50 and the bottom end 52.

The heat transfer element 20, such as the heat pipe 34, is coupled with the window 12 to dissipate heat from the heat transfer element 20 onto the window 12 orthogonally to the longitudinal direction along axis 48. It is noteworthy that only one embodiment of the present disclosure may require that heat output from the heat transfer element be orthogonal to the longitudinal direction along axis 48. Other embodiments provide that the heat transfer to the window occurs in a manner that is non-orthogonal to the longitudinal direction. In one embodiment, the heat transfer from the element 20 to the window 12 may occur through direction conduction. However, as described below, other heat transfer is effectuated by any one of advection, convection, or radiation. It may even be possible to effectuate heat transfer from the element 20 to the window 12 through mechanisms of boiling, condensation, and melting.

Figure 3:
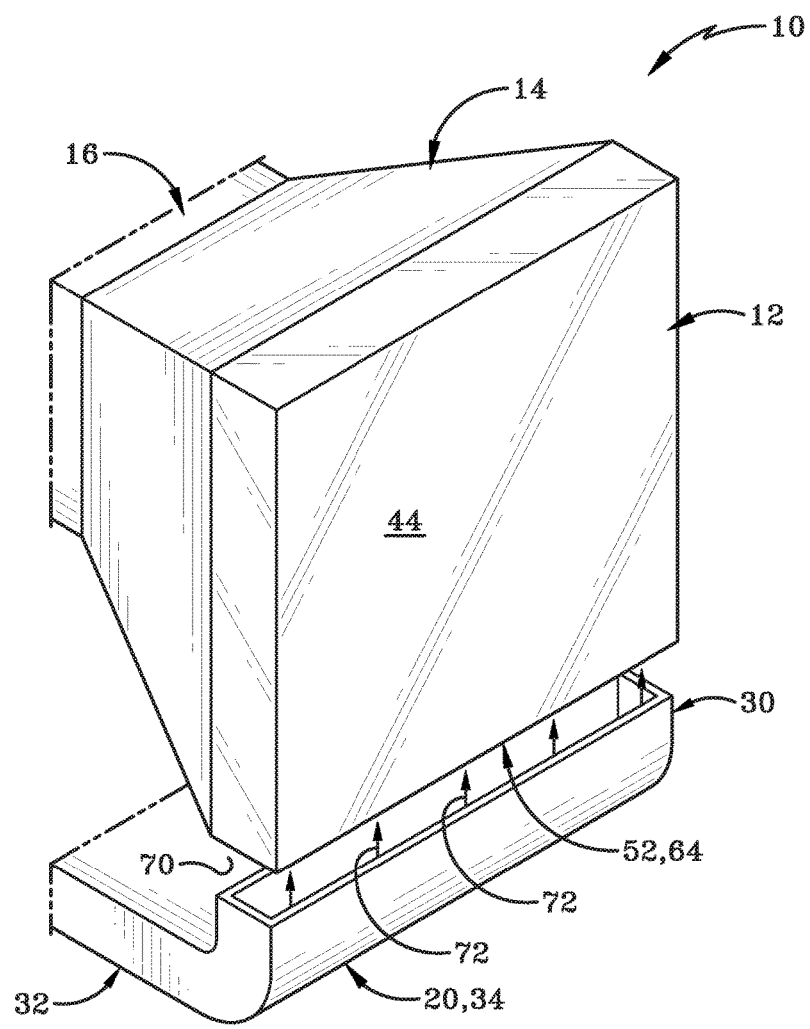
FIG. 3 is a diagrammatic perspective view of the heat transfer element being positioned adjacent the optical window in order to transfer heat exhausted from the cooler into the window.

FIG. 3 depicts that the second end 30 of the heat pipe 34 is positioned adjacent the window 12. More particularly, the second end 30 of the heat pipe 34 is positioned below the bottom end 52 of the window 12. In one particular embodiment, the second end 30 may be slightly spaced below the minor surface 64 of the bottom end 52 to establish a slight gap 70 to effectuate the upward transfer of heat as indicated by arrow 72.

Figure 4:
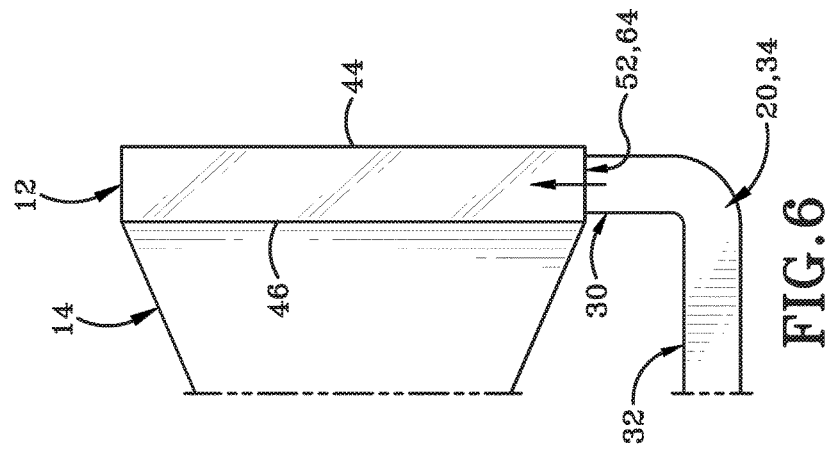
FIG. 4 is a diagrammatic side elevation view of the heat transfer element dissipating heat forwardly of the front surface of the optical window.

FIG. 4 depicts an alternative arrangement in which heat is dissipated along arrow 74 orthogonal to the longitudinal direction of the window 12. The second end 30 of the heat pipe 34 may be slightly spaced from the bottom end 52 of the window 12 by gap 70. Heat may dissipate in the vertical direction as indicated by arrow 74. In this particular embodiment, the heat dissipates and is output from the heat transfer element 20 across the major exterior surface (first surface 44) of the window 12. By heat output in the direction of arrow 74, the heat is dissipated orthogonally to the longitudinal direction of the window 12.

Figure 5:
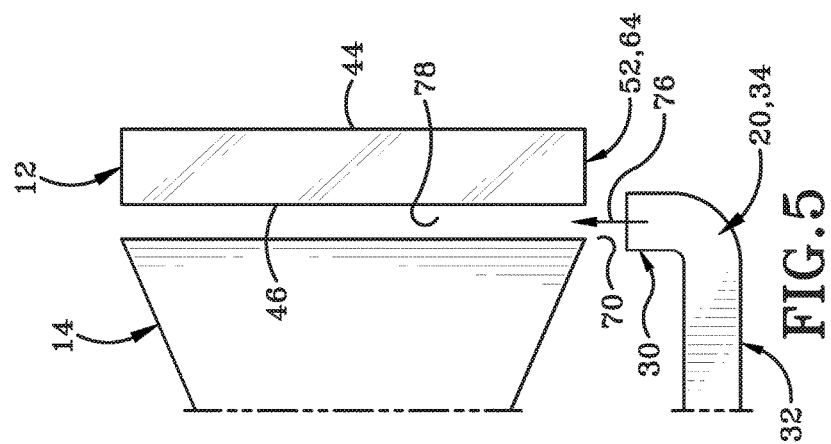
FIG. 5 is a diagrammatic side elevation view of the heat transfer element dissipating heat rearward from the rear surface of the optical window.

FIG. 5 depicts an alternative embodiment in which heat is dissipated onto the window 12 in a direction orthogonal to the longitudinal direction along axis 48 of the window 12.

The second end 30 of the heat pipe 34 is spaced below the bottom end 52 of the window 12 by a gap 70. Heat may be directed vertically upward in the direction indicated by arrow 76. In this particular embodiment, the heat is directed vertically in the direction of arrow 76 across the major interior surface (second surface 46) of the window 12. In this particular embodiment, the optics 14 may be spaced apart from the second surface 46 by a gap 78 to enable the heat to be output across the major interior surface (second surface 46) of the window 12.

Figure 6:
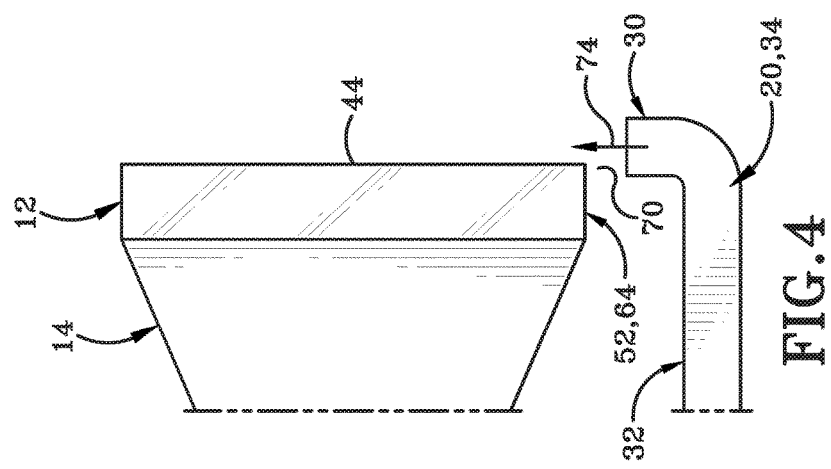
FIG. 6 is a diagrammatic side elevation view of the heat transfer element coupled directly to a minor surface defined by a bottom edge of the optical window.

FIG. 6 depicts an embodiment in which the second end 30 of the heat pipe 34 is directly coupled to one of the minor surface areas of the window 12. In this particular embodiment, the second end 30 of the heat pipe 34 is directly coupled with the minor surface area 64 defined by the bottom end 52 of the window 12. The heat transfer element 20 (i.e., heat pipe 34) outputs heat to the minor surface 64 of the window 12. While the second end 30 is shown as connected with the minor surface 64, it is to be understood that the heat transfer element 20 may be coupled with any of the other minor surfaces 62, 66, 68 provided that the heat is dissipated onto the window orthogonal to the longitudinal direction.

Figure 7:
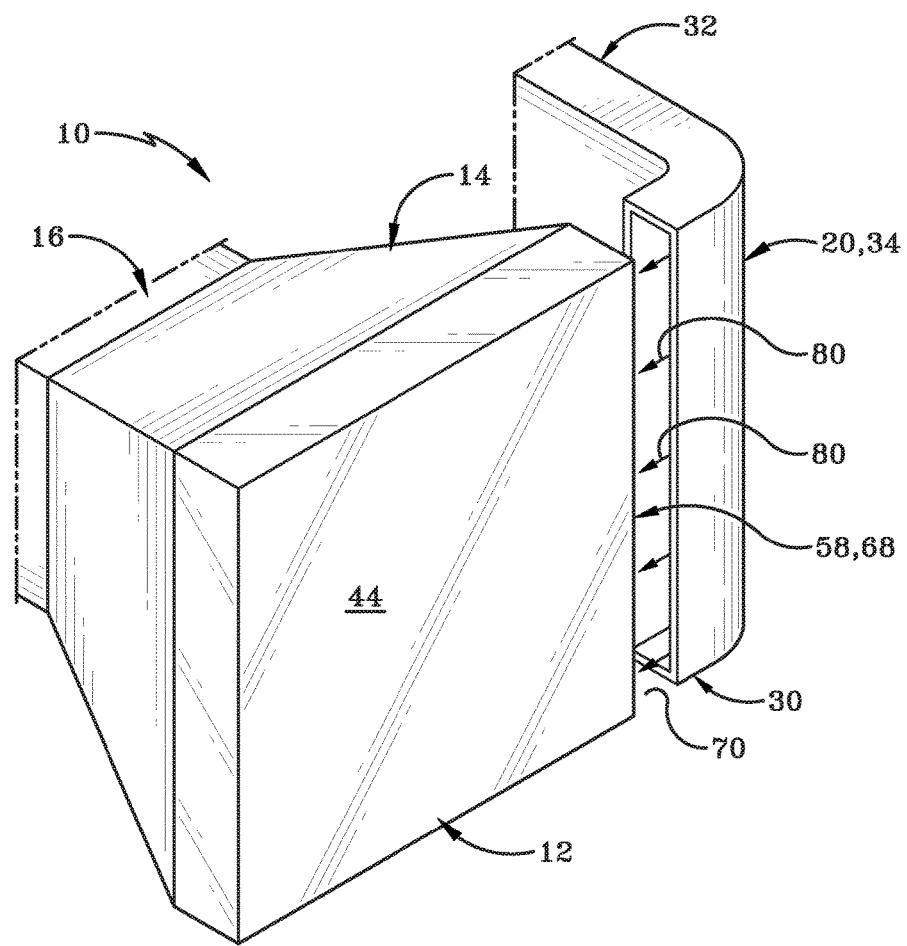
FIG. 7 is a diagrammatic perspective view of the heat transfer element being positioned adjacent one of the minor surfaces defined by a vertical side of the optical window in order to transfer heat transversely across the optical window.
Figure 8A:
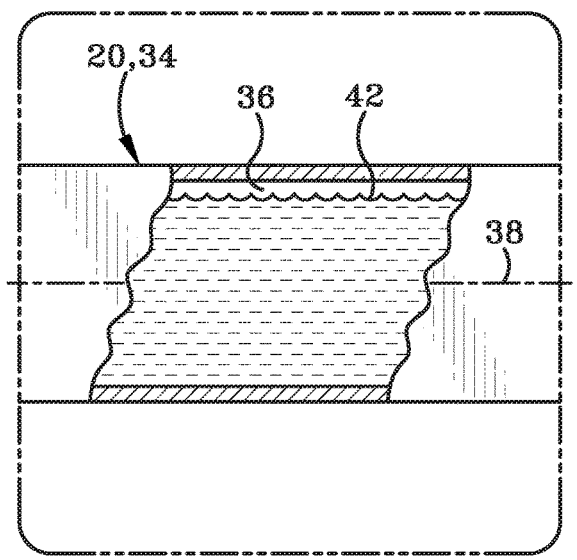
FIG. 8A is an enlarged section view of the interior of the heat transfer element when embodied as a heat pipe depicting fluid inside of a bore thereof.
Figure 8B:
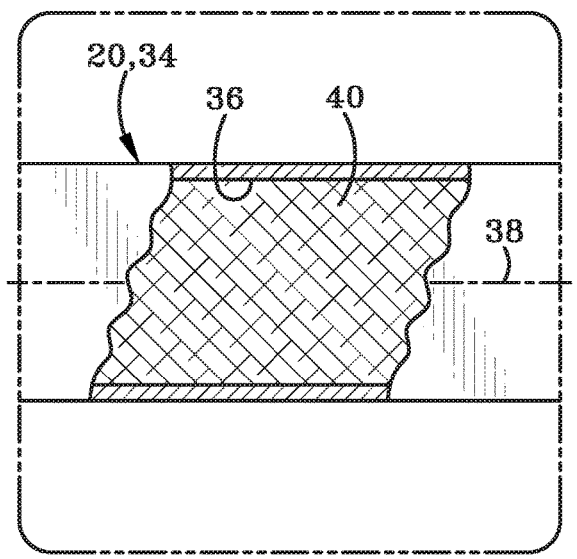
FIG. 8B is a diagrammatic section view depicting a wick or fiber inside the bore of the heat pipe.

FIG. 7 depicts that the second end 30 of the heat transfer element 20, such as a heat pipe 34, may be directly connected or positioned closely adjacent the minor surface area 68 defined by the second side 58 of the window 12. Heat flows in along the transverse axis 60 in the transverse direction as indicated by arrow 80. Thus, heat is dissipated from the heat transfer element 20 in the transverse direction along transverse axis 60, which is orthogonal to the longitudinal axis, as indicated by arrow 80 relative to the window 12.

In the instances in which the heat transfer element 20 is in the form of heat pipe 34, the bore 36 may include an internal diameter. The internal diameter of the bore 36 may be less than the thickness of the window 12 established between the first surface 44 and the second surface 46. When the internal diameter of the bore 36 is less than the thickness of the window, this would enable heat to be dissipated along one major surface of the window while purposefully not dissipating heat directly to the other major surface of the window. In another particular embodiment, the internal diameter of the bore 36 may be equal to the thickness of the window 12 such as what is shown in FIG. 6. When the internal diameter of the bore 36 is about equal to the thickness of the window, this would enable heat to be dissipated to the minor surface of the window, such as one of the edges. This may be effectuated by direct contact, radiation, convection, or conduction. Alternatively, the internal diameter of the bore 36 may be greater than the thickness of the window 12 which would enable heat to be dissipated contemporaneously along the first surface 44 and the second surface 46 orthogonal to the longitudinal direction of the window 12. Furthermore, as indicated in FIG. 1, the heat pipe 34 may include at least one bend in the heat pipe 34 positioned closer to the second end 30 than the first end 28. The bend in the heat pipe 34 may be at least 45° relative to a major axis of the heat pipe 34. In one particular embodiment, the bend in the heat pipe 34 is about 90° and adjacent the second end 30 to direct heat outwardly from the heat pipe 34 and onto the window 12 orthogonally to the longitudinal direction.

In one particular embodiment, window 12 may be fabricated from IR fused quartz manufactured by the fusion of naturally occurring crystal quartz in an electric vacuum furnace. Window 12 may have a very low water content (OH) of less than 5 parts per million. These IR fused quartz of window 12 typically excellent transmission from 260 nm thought to 3500 nm and low bubble, striae and inclusion content. Window 12 may have an anti-reflective (AR) coating for wavelength applications between the useful range of 260 nm to 3500 nm for increased transmission performance.

Window 12 may include flat surfaces 44, 46 that generally lie along parallel planes. However, as is typical in defense applications, the window 12 may be domed such that the major exterior surface is hemispherical in shape or a whole or partial convex dome. A dome is an optical window composed of two parallel curved surfaces. Domes are commonly used in defense applications and often in extreme environments such as submersible ROVs. The longitudinal direction of a dome or domed window refers to the direction between the outer convex surface and the inner concave surface.

Additionally, optical window 12 may be an optically flat, transparent optical material that allows light into the optical system 1 through optics 14 that guide light to sensor 16. Window 12 may be made from materials like N-BK7, Fused Silica, Sapphire, Germanium, Zinc Selenide, Calcium Fluoride, and Magnesium Fluoride. Window 12 may be parallel or wedged with laser grade surface quality and surface flatness for common or very demanding interferometer measurements. AR coated optical windows to improve the transmission from UV to IR wavelength regime.

In one example, window 12 may be a parallel window that is parallel to less than 30 arc sec for minimal transmitted beam deviation with a $\leq \lambda/20$ surface flatness and 10-5 scratch-dig. In another example, window 12 may a high-energy laser wedged window that is damage resistant up to 10 J/cm2, and includes UV fused silica for thermal stability with low wavefront distortion and hard refractory coatings. In another example, window 12 may be a sapphire optical windows with high transmittance from 150 nm to 5 μm and extremely hard and durable material that is ideal for thermally demanding environments. In another example, window 12 may be a germanium optical window that minimizes chromatic aberration due to low dispersion and can be anti-reflection coated for 3 μm to 12 μm or 8 μm to 12 μm that is beneficial for IR applications. In another example, window 12 may be a zinc selenide optical window with high transmission (>90%) from 3 μm to 12 μm and low dispersion and low absorption coefficient that is beneficial for thermally demanding environments. In another example, window 12 may be a calcium fluoride optical window with a high average transmittance and low chromatic aberrations that may be beneficial for UV to NIR applications (180 nm to 8 μm). In another example, window 12 may be a magnesium fluoride optical window with high transmittance from 0.15μ m to 6.5 μm and high resistance to thermal and mechanical shock that is beneficial for deep UV to infrared regions. In another example, window 12 may be an interferometer flat optical window with UV fused silica for excellent thermal stability and $\lambda/10$ surface flatness and 10-5 scratch-dig with a slight wedge that virtually eliminates internal fringes. Although these example are provided, clearly other optical windows fabricated from different materials exhibiting different properties are entirely possible.

Figure 9:
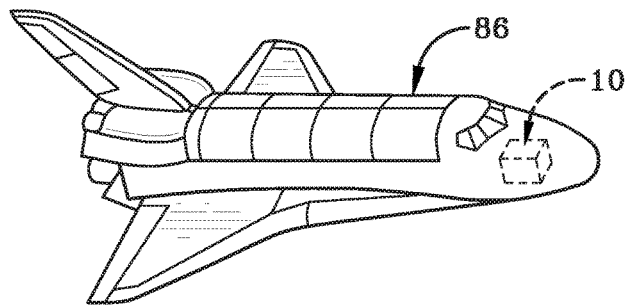
FIG. 9 is a diagrammatic view of a land vehicle and an aerial vehicle implemented with the optical system of the present disclosure.
Figure 9:
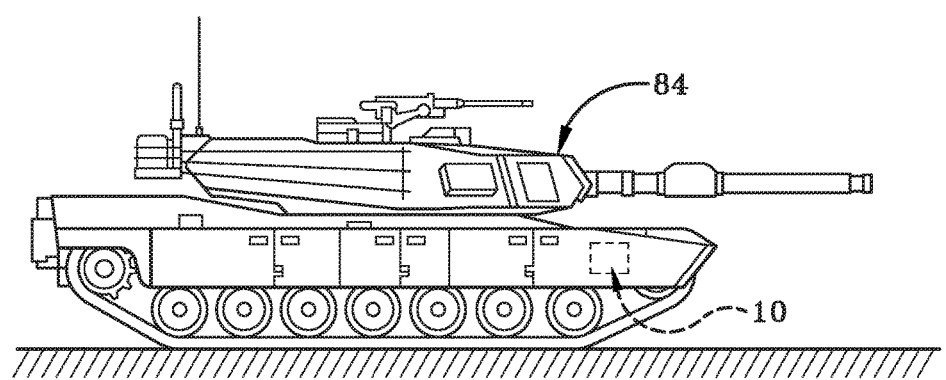

FIG. 9 depicts that optical system 10 may be carried by any vehicle or platform that senses images and needs to de-ice an optical window 12. The vehicle or platform may be land-based, such as land-based vehicle 84, or an aerial vehicle/platform 86. In one particularly embodiment, the vehicle or platform operates at high altitudes or in outer space. The aerial vehicles/platform 86 can be any type of flying device or orbiting device regardless of whether it is manned or unmanned. The vehicle 84 or platform 86 may include an outer surface that is typically fabricated from an at least semi-rigid material. The window 12 of optical system 10 may be conformal to the outer surface of the aerial vehicle/platform 86. Accordingly, the exterior major surface (i.e., first surface 44) may be conformal along a similar plane or curved path (in the case of a curved window 12) as the surface of the platform 86. Due to the high altitude environment, the window 12 may need to be de-iced. System 10 enables the heat exhausted from the cooler 18 to be applied, via heat transfer element 20, to the window 12 in order to warm and de-ice the same. Thus, system 10 recycles heat exhausted from the cooler 18 to cool the sensor 16 (i.e., an FPA). Thus, collectively, the system 10 is able to reduce size, weight, and power from conventional optical systems that would require a separate deicing system or deicing heating element for the window thereof. It should be noted that the window 12 does not need to be conformal with the outer surface of the aerial platform for optical system 10 to be effective. For example, when window 12 is a dome, the outer convex surface of the domed window is not necessarily conformal to the outer surface of the platform 86. Optical system 10 is an efficient manner of reducing power when an optical window needs to be warmed and the heat exhausted from a cooler cooing an image sensor is otherwise not being efficiently dissipated. In one example, it is estimated that optical system 10 may reduce power draw by about 10 to 15 watts from conventional optical systems that have a cooler and a separate de-icing device.

Optical system 10 may additionally be equipped with a cut-off switch. If sensor cooling is detrimental, either an electrical or a mechanical disconnect cut-off switch may be required to "turn off" this additional cooling. The window heater may still need to operate in some conditions, but this reduces the overall power needed for the sensor 16.

Various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Figure 10:
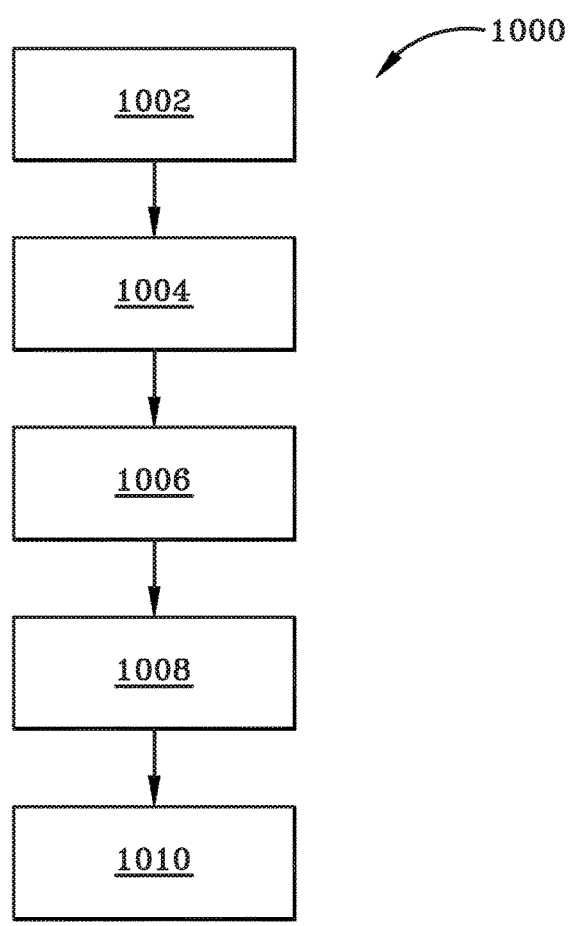
FIG. 10 is a flow chart depicting an exemplary method in accordance with one aspect of the present disclosure.

For example, FIG. 10 depicts a method of operating optical system 10 generally at 1000. The method 100 includes receiving electromagnetic radiation through the optical window 12 in the optical system 10, which is shown generally at 1002. Method 1000 further includes sensing the electromagnetic radiation on the imaging sensor 16 in the optical system 10, which is shown generally at 1004. Method 1000 further includes cooling the imaging sensor 16 with the cooler 18, which is shown generally at 1006. Method 1000 further includes transferring heat from the cooler 18 to the optical window 12 via the heat transfer element 20, which is shown generally at 1008. Method 1000 may further include warming the optical window 12 with heat from the heat transfer element 20 coupled to the cooler 18. Additionally, method 1000 may further include receiving the electromagnetic radiation through the optical window along a first direction, such as the longitudinal direction or another direction; and transferring heat to the optical window in a direction orthogonal to the first direction.

Other operations of the method 1000 could be implement in a number of ways as discussed herein. For example, method 1000 may include various steps or processes that effectuate dissipating from the heat transfer element in the vertical direction; or fabricating the optical window from a thermally conductive material permitting heat to move longitudinally through the window to warm the major exterior surface; or coupling the heat transfer element to the heat output of the cooler and coupling the second end thereof, at least indirectly, to the window; or exhausting heat from the cooler to travel through the bore of the heat pipe from the cooler to the window; or selecting the internal diameter of the bore, wherein the internal bore is one of the following: (i) less than a thickness of the window, (ii) equals a thickness of the window, and (iii) greater than a thickness of the window. Other manners, steps, or processes to accomplish other aspects of the optical system 10 as discussed herein are entirely possible.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

The above-described embodiments can be implemented in any of numerous ways. For example, embodiments of technology disclosed herein may be implemented using hardware, software, or a combination thereof. For example, software can control de-icing logic that operates the heat transfer element 20 and the cooler 18 in accordance with the cooling needs of the sensor 16 and the de-icing needs of the window 12. When implemented in software, the software code or instructions can be executed on any suitable processor or collection of processors, whether provided in a single computer or distributed among multiple computers. Furthermore, the instructions or software code can be stored in at least one non-transitory computer readable storage medium 82. For example, optical system 10 may include the at least one non-transitory computer readable storage medium 82 in operative communication with the cooler 18 and the heat transfer element 20 and having instructions encoded thereon that when executed by a processor implement operations to maintain the sensor at the optimal operating temperature and selectively warm the window, the instructions including: determine whether the window needs to be deiced; effectuate heat transfer across the heat transfer element in response to a determination that the window needs to be deiced; and continue to transfer heat to the window across the heat transfer element until the window no longer needs to be de-iced.

Also, a computer or smartphone utilized to execute the software code or instructions of the de-icing logic of the optical system 10 via its processors may have one or more input and output devices. These devices can be used, among other things, to present a user interface. Examples of output devices that can be used to provide a user interface include printers or display screens for visual presentation of output and speakers or other sound generating devices for audible presentation of output. Examples of input devices that can be used for a user interface include keyboards, and pointing devices, such as mice, touch pads, and digitizing tablets. As another example, a computer may receive input information through speech recognition or in other audible format.

Such computers or smartphones that control the de-icing logic of the optical system 10 may be interconnected by one or more networks in any suitable form, including a local area network or a wide area network, such as an enterprise network, and intelligent network (IN) or the Internet. Such networks may be based on any suitable technology and may operate according to any suitable protocol and may include wireless networks, wired networks or fiber optic networks.

The various methods or processes outlined herein may be coded as software/instructions for the de-icing logic of the optical system 10 that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine.

In this respect, various inventive concepts may be embodied as a computer readable storage medium (or multiple computer readable storage media) (e.g., a computer memory, one or more floppy discs, compact discs, optical discs, magnetic tapes, flash memories, USB flash drives, SD cards, circuit configurations in Field Programmable Gate Arrays or other semiconductor devices, or other non-transitory medium or tangible computer storage medium) encoded with one or more programs that, when executed on one or more computers or other processors, perform methods that implement the various embodiments of the disclosure discussed above. The computer readable medium or media can be transportable, such that the program or programs stored thereon can be loaded onto one or more different computers or other processors to implement various aspects of the present disclosure as discussed above.

The terms "program" or "software" or "instructions" are used herein in a generic sense to refer to any type of computer code or set of computer-executable instructions that can be employed to program a computer or other processor to implement various aspects of embodiments as discussed above. Additionally, it should be appreciated that according to one aspect, one or more computer programs that when executed perform methods of the present disclosure need not reside on a single computer or processor, but may be distributed in a modular fashion amongst a number of different computers or processors to implement various aspects of the present disclosure.

Computer-executable instructions may be in many forms, such as program modules, executed by one or more computers or other devices. Generally, program modules include routines, programs, objects, components, data structures, etc. that perform particular tasks or implement particular abstract data types. Typically the functionality of the program modules may be combined or distributed as desired in various embodiments.

Also, data structures may be stored in computer-readable media in any suitable form. For simplicity of illustration, data structures may be shown to have fields that are related through location in the data structure. Such relationships may likewise be achieved by assigning storage for the fields with locations in a computer-readable medium that convey relationship between the fields. However, any suitable mechanism may be used to establish a relationship between information in fields of a data structure, including through the use of pointers, tags or other mechanisms that establish relationship between data elements.

All definitions, as defined and used herein, should be understood to control over dictionary definitions, definitions in documents incorporated by reference, and/or ordinary meanings of the defined terms.

"Logic", as used herein, includes but is not limited to hardware, firmware, software and/or combinations of each to perform a function(s) or an action(s), and/or to cause a function or action from another logic, method, and/or system. For example, based on a desired application or needs, logic may include a software controlled microprocessor, discrete logic like a processor (e.g., microprocessor), an application specific integrated circuit (ASIC), a programmed logic device, a memory device containing instructions, an electric device having a memory, or the like. Logic may include one or more gates, combinations of gates, or other circuit components. Logic may also be fully embodied as software. Where multiple logics are described, it may be possible to incorporate the multiple logics into one physical logic. Similarly, where a single logic is described, it may be possible to distribute that single logic between multiple physical logics.

Furthermore, the logic(s), such as the de-icing logic, may provide specific functionality directly related to structure that addresses and resolves some problems identified herein. The logic(s) may also provide significantly more advantages to solve these problems by providing an exemplary inventive concept as specific logic structure and concordant functionality of the method and system. Furthermore, the logic(s) may also provide specific computer implemented rules that improve on existing technological processes. The logic(s) provided herein extends beyond merely gathering data, analyzing the information, and displaying the results. Further, portions or all of the present disclosure may rely on underlying equations that are derived from the specific arrangement of the equipment or components as recited herein. Thus, portions of the present disclosure as it relates to the specific arrangement of the components are not directed to abstract ideas. Furthermore, the present disclosure and the appended claims present teachings that involve more than performance of well-understood, routine, and conventional activities previously known to the industry. In some of the method or process of the present disclosure, which may incorporate some aspects of natural phenomenon, the process or method steps are additional features that are new and useful.

The indefinite articles "a" and "an," as used herein in the specification and in the claims, unless clearly indicated to the contrary, should be understood to mean "at least one." The phrase "and/or," as used herein in the specification and in the claims (if at all), should be understood to mean "either or both" of the elements so conjoined, i.e., elements that are conjunctively present in some cases and disjunctively present in other cases. Multiple elements listed with "and/or"

should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc. As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures.

An embodiment is an implementation or example of the present disclosure. Reference in the specification to "an embodiment," "one embodiment," "some embodiments," "one particular embodiment," "an exemplary embodiment," or "other embodiments," or the like, means that a particular feature, structure, or characteristic described in connection with the embodiments is included in at least some embodiments, but not necessarily all embodiments, of the invention. The various appearances "an embodiment," "one embodiment," "some embodiments," "one particular embodiment," "an exemplary embodiment," or "other embodiments," or the like, are not necessarily all referring to the same embodiments.

If this specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Additionally, the method of performing the present disclosure may occur in a sequence different than those described herein. Accordingly, no sequence of the method should be read as a limitation unless explicitly stated. It is recognizable that performing some of the steps of the method in a different order could achieve a similar result.

In the foregoing description, certain terms have been used for brevity, clearness, and understanding. No unnecessary limitations are to be implied therefrom beyond the requirement of the prior art because such terms are used for descriptive purposes and are intended to be broadly construed.

Moreover, the description and illustration of various embodiments of the disclosure are examples and the disclosure is not limited to the exact details shown or described.

The invention claimed is:

1. An optical system comprising:
   a window adapted to receive an electromagnetic wave therethrough;
   an imaging sensor proximate the window adapted to sense the electromagnetic wave;
   a cooler coupled to the sensor to maintain the sensor at an optimal operating temperature, and the cooler having a heat output;
   a heat transfer element coupling the heat output of the cooler with the window to transfer heat from the cooler to warm the window;
   a first surface opposite a second surface defining a longitudinal direction therebetween, wherein the first surface of the window is a major exterior surface and the second surface is a major interior surface, and wherein the electromagnetic wave propagates in the longitudinal direction through the window;
   a minor surface of the window defined by a thickness of the window between the first surface and the second surface; and
   wherein the heat transfer element is coupled, at least indirectly, to the minor surface of the window to dissipate heat orthogonal to the longitudinal direction.

2. The optical system of claim 1, wherein the window further includes:
   a top end and a bottom end defining a vertical direction therebetween;
   wherein heat is dissipated from the heat transfer element in the vertical direction.

3. The optical system of claim 2, further comprising:
   wherein the minor surface of the window is defined by the bottom end formed from a thickness of the window between the first surface and the second surface;
   wherein the heat transfer element outputs heat to the minor surface of the window, and the window is fabricated from a conductive material permitting heat to move in a direction that is orthogonal to the longitudinal direction.

4. The optical system of claim 1, wherein the window further includes:
a first side and a second side defining a transverse direction therebetween;
wherein heat is dissipated from the heat transfer element in the transverse direction orthogonally to the longitudinal direction.

5. The optical system of claim 4, further comprising:
wherein the minor surface of the window defined by the first side formed from a thickness of the window between the first surface and the second surface;
wherein the heat transfer element outputs heat to the minor surface of the window, and the window is fabricated from a conductive material permitting heat to move in a transverse direction that is orthogonal to the longitudinal direction.

6. The optical system of claim 1, wherein the heat transfer element comprises:
a heat pipe including a first end and a second end, wherein the first end is coupled to the heat output of the cooler and the second end is coupled, at least indirectly, to the minor surface of the window.

7. The optical system of claim 6, further comprising:
a bore defined by the heat pipe extending between the first end and the second end, wherein heat exhausted from the cooler travels through the bore of the heat pipe from the cooler to the window.

8. The optical system of claim 7, further comprising:
fluid in the bore to effectuate heat transfer through the fluid from the heat output of the cooler to the window.

9. The optical system of claim 7, further comprising:
a wick in the bore to effectuate heat transfer along the wick from the heat output of the cooler to the window.

10. The optical system of claim 7, further comprising:
an internal diameter of the bore, wherein the internal bore is one of the following: (i) less than a thickness of the window, (ii) equals a thickness of the window, and (iii) greater than a thickness of the window.

11. The optical system of claim 6, further comprising:
at least one bend in the heat pipe positioned closer to the second end than the first end, wherein the at least one bend is at least 45° relative to a major axis of the heat pipe.

12. The optical system of claim 11, wherein the at least one bend in the heat pipe is about 90° and adjacent the second end to direct heat outwardly from the heat pipe and onto the window.

13. The optical system of claim 1, further comprising:
optics adjacent the window adapted to receive the electromagnetic wave therethrough; and
wherein the heat transfer element includes a first end coupled to the cooler and a second end coupled, at least indirectly, to the minor surface of the window, and an central portion having a major axis of the heat transfer element positioned between the first end and the second end, wherein the central portion is positioned adjacent the optics.

14. The optical system of claim 1, further comprising:
de-icing logic controlling the cooler to cool the sensor and controlling the heat transfer element to warm the window.

15. The optical system of claim 14, further comprising:
at least one non-transitory computer readable storage medium having instructions encoded thereon that when executed by a processor implement operations to maintain the sensor at the optimal operating temperature and selectively warm the window, the instructions including:
determine whether the window needs to be deiced;
effectuate heat transfer across the heat transfer element in response to a determination that the window needs to be deiced; and
continue to transfer heat to the window across the heat transfer element until the window no longer needs to be de-iced.

16. A method comprising:
receiving electromagnetic radiation through an optical window in an optical system through the optical window along a first direction;
sensing the electromagnetic radiation on an imaging sensor in the optical system;
cooling the imaging sensor with a cooler;
transferring heat from the cooler to the optical window via a heat transfer element in a direction orthogonal to the first direction; and
warming the optical window with heat from the heat transfer element coupled to the cooler.

* * * * *